United States Patent [19]

Lurey et al.

[11] 4,019,150
[45] Apr. 19, 1977

[54] PA PROTECTION CIRCUIT FOR A SINGLE SIDEBAND RADIO

[75] Inventors: Daniel Morris Lurey, Hoffman Estates; David Michael Drury, Mundelein, both of Israel

[73] Assignee: Motorola, Inc., Schaumburg, Ill.

[22] Filed: Nov. 17, 1975

[21] Appl. No.: 632,542

[52] U.S. Cl. .................................. 330/2; 330/134; 330/141; 330/145; 330/207 P; 325/150

[51] Int. Cl.² ...................................... H03G 3/20

[58] Field of Search ............... 330/2, 29, 134, 141, 330/145, 207 P; 325/150, 151, 319

[56] References Cited

UNITED STATES PATENTS

| | | | |
|---|---|---|---|
| 3,020,529 | 2/1962 | Turner | 330/207 P X |
| 3,366,883 | 1/1968 | Griffin et al. | 325/150 X |
| 3,641,451 | 2/1972 | Hollingsworth et al. | 330/134 |
| 3,790,896 | 2/1974 | Shimizu et al. | 330/145 X |
| 3,852,669 | 12/1974 | Bowman et al. | 330/207 P X |
| 3,870,957 | 3/1975 | Straw | 325/150 |

*Primary Examiner*—James B. Mullins
*Attorney, Agent, or Firm*—James W. Gillman; Eugene A. Parsons; Victor Myer

[57] ABSTRACT

A directional power detector mounted between the power amplifier and antenna which supplies audio frequency output signals indicative of forward and reflected power, circuitry for summing and converting the output signals from the power detector means to a DC potential proportional to the magnitude thereof and a transistor connected in shunt at the input of the power amplifier and controlled by the DC potential for controlling the peak envelope power at the antenna.

8 Claims, 3 Drawing Figures

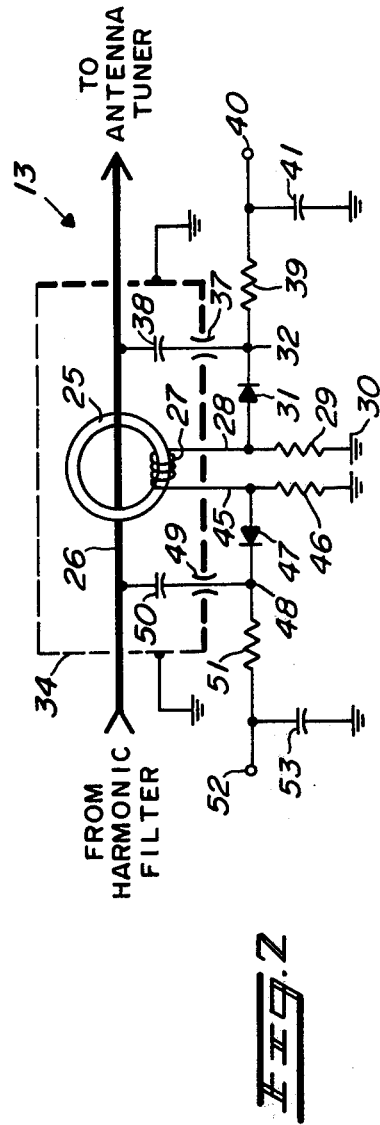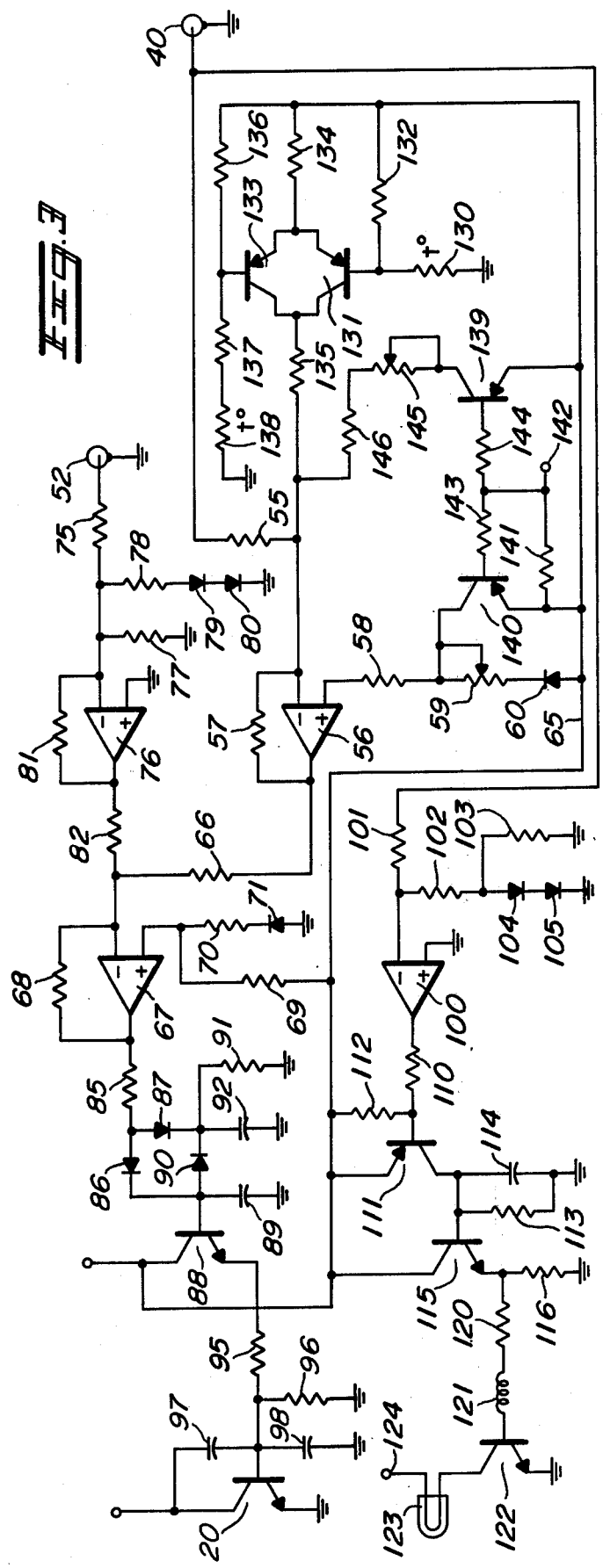

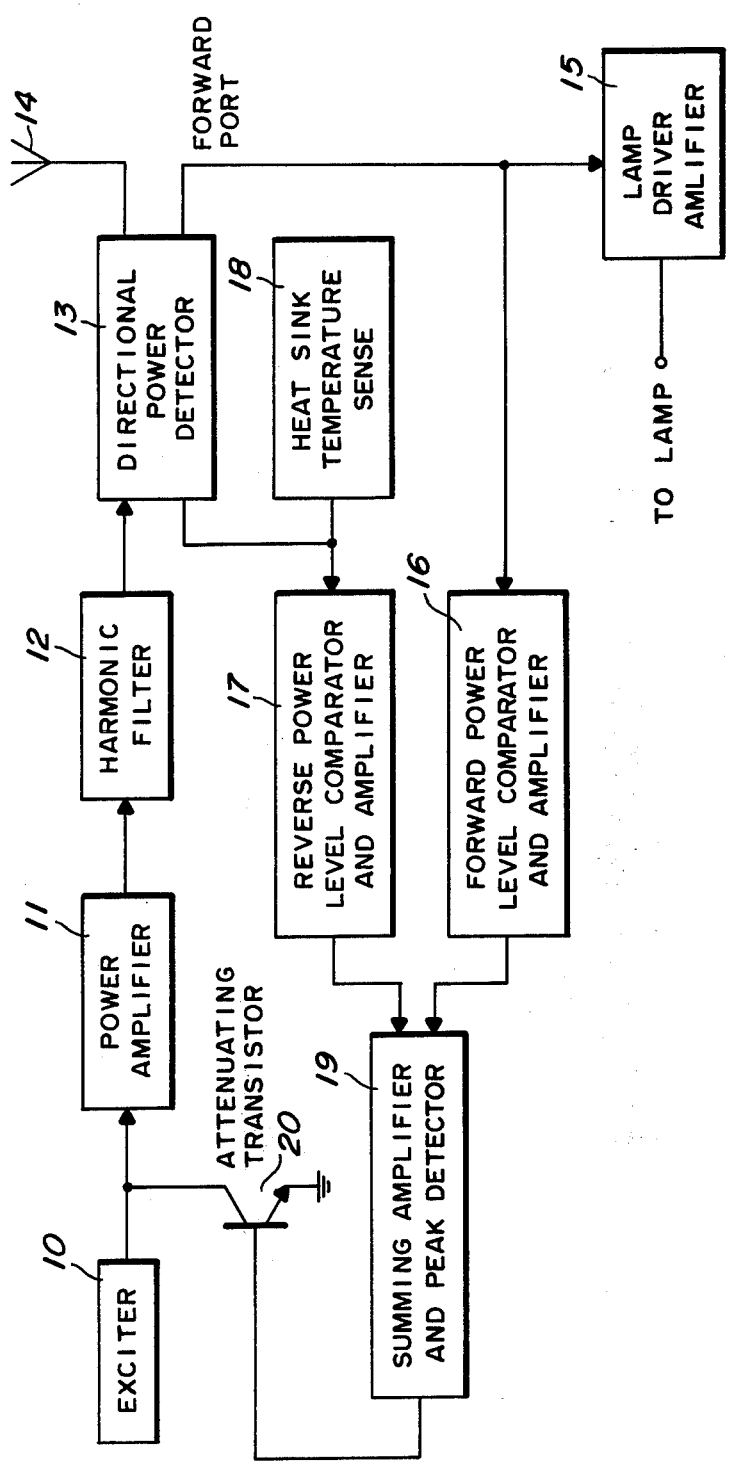

PA PROTECTION CIRCUIT FOR A SINGLE SIDEBAND RADIO

BACKGROUND OF THE INVENTION

1. Field of the Invention

At the present time, because of reliability, ruggedness and cost, transistors are utilized throughout transmitters including the power amplifiers. The transistors, however, are subject to permanent damage due to excessive currents, voltages and temperatures. The excessive currents, voltages and temperatures can occur when the output of the transmitter is not terminated with a proper load or antenna. A particular problem is presented in mobile or portable transmitters where the probability of load mismatch is high due to physical obstructions to antennas, antenna damage, or errors by service personnel. Overloading of the circuitry can occur due to the application of too much forward power to the antenna and/or too much reflected power from the antenna, in case of mismatches or the like. It is desirable, therefore, to provide a power amplifier protection circuit which operates in the event the forward and/or reflected power become too high during operation.

In single sideband radio transmitters, the problems are somewhat different than those encountered in FM type radio transmitters. Protection circuits in FM type radio transmitters can monitor the average power, voltage or current applied to the antenna or available in the power amplifiers and control the drive to the power amplifiers to maintain the output power at a predetermined average level. However, in single sideband radio transmitters the power output varies in accordance with the audio modulating signal applied to the transmitter. Thus, the power output of a single sideband radio continuously varies at an audio frequency and is extremely difficult to control since the average power may be well within the defined limits and power peaks, sufficient to damage transistors and the like, may be prevalent.

2. Description of the Prior Art

Prior art protection circuits, such as disclosed in U.S. Pat. Nos. 3,641,451 and 3,866,136, both entitled "Amplifier Protection Circuit", measure the average forward and reflected power at the antenna and are generally not capable of following audio frequency variations in the power. In general, the prior art protection circuits utilize a detector for providing a foward and reflected signal indicative of the forward and reflected power. These signals are then immediately rectified and filtered to provide a relatively constant DC signal utilized to control the power supplied by the power amplifier. In single sideband transmitters the power applied to the power amplifier is generally controlled by limiting the audio input level from the microphone or controlling the gain of an intermediate amplifier stage. These methods of limiting the output power are undesirable because nonlinearities occur which increase the intermodulation products in the transmitted signal.

SUMMARY OF THE INVENTION

The present invention pertains to a protection circuit for use in a single sideband transmitter including directional power detector means coupled between the power amplifier and the antenna and providing a first audio frequency signal varying in accordance with the modulated RF signal and indicative of forward power supplied to the antenna and a second audio frequency signal varying in accordance with the modulated RF signal and indicative of reflected power from the antenna, first and second level detector means for providing the signals with a predetermined level, means for summing the signals to provide one signal indicative of the sum thereof, peak detector means for converting the sum to a DC potential proportional to the magnitude of the sum of the two signals and attenuating means controllable by the DC potential for shunting a portion of the input signal from the power amplifier to control peak envelope power at the antenna.

It is an object of the present invention to provide a new and improved protection circuit for power amplifiers in single sideband transmitters.

It is a further object of the present invention to provide a protection circuit for a power amplifier in a single sideband transmitter which controls peak envelope power at the antenna.

It is a further object of the present invention to provide a protection circuit for a power amplifier in a single sideband transmitter which has a relatively fast attack time and relatively slow decay time so that the circuit is capable of maintaining the peak power below a predetermined value during peaks in the modulated RF signal and maintaining the input power attenuation factor during pauses in the modulated RF signal.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures:

FIG. 1 is a block diagram of a portion of a single sideband transmitter with an embodiment of the present protection circuit coupled thereto;

FIG. 2 is a schematic diagram of the directional power detector illustrated in block form in FIG. 1; and FIG. 3 is a schematic diagram of the protection circuit illustrated in block form in FIG. 1, except for the directional power detector.

DESCRIPTION OF THE PREFERRED EMBODIMENT

Referring specifically to FIG. 1, the numeral 10 indicates a block designated "exciter" which supplies the driving signal to a power amplifier 11. The output of the power amplifier 11 is supplied through a harmonic filter 12 and directional power detector 13 to an antenna 14 for radiating the RF power to remote receivers. The blocks 10, 11 and 12 and the antenna 14 make up a single sideband transmitter. The modulating means, oscillators, preamplifiers, etc. making up the major portion of the transmitter are illustrated as the single block 10 for simplicity and it should be understood that the signal supplied by the block 10 is an audio modulated RF signal. The power amplifier 11, harmonic filter 12 and antenna 14 are not described in detail since single sideband transmitters are well known in the art and none of these components form a portion of this invention.

The directional power detector 13 has a first output or forward port which is connected to a lamp driver amplifier 15 and a forward power level comparator and amplifier 16. The directional power detector 13 has a second output, or reflected port, which is connected to a reverse power level comparator and amplifier 17. A heat sink and temperature sensor 18 is also connected to the input of the level comparator and amplifier 17. Outputs of the first level comparator and amplifier 16 and second level comparator and amplifier 17 are applied to a summing amplifier and peak detector 19 and the output thereof is applied to the base of an NPN type transistor 20. The transistor 20 is connected in shunt with the power amplifier 11 by connecting the emitter to ground and the collector to the input of the power amplifier 11. Thus, as the transistor 20 is driven harder more signal is shunted from the power amplifier 11 so that less power is available at the output thereof. The directional power detector 13 provides the signals indicative of power being applied to the antenna 14 and power reflected from the antenna 14. The directional power detector 13 is described in conjunction with FIG. 2.

The directional power detector, generally designated 13 in FIG. 2, includes a ferrite toroidal core 25 with a lead 26, connected from the output of the harmonic filter 12 to the antenna 14, passing through the central opening and serving as a primary of a transformer, the secondary of which is a coil 27 wrapped around the toroidal core 25. A first lead 28 of the coil 27 is connected through a resistor 29 to a reference potential, such as ground 30. The lead 28 is also connected to the anode of a diode 31, the cathode of which is connected to a terminal 32. To prevent radiation the toroidal core 25, a portion of lead 26 and the secondary coil 27 are enclosed in a shield illustrated by dotted line 34, which is grounded as illustrated. The terminal 32 is connected through a feed through capacitor 37 and a capacitor 38 located within the shield 34 to the lead 26. The terminal 32 is also connected through a resistor 39 to a first output terminal 40. The output terminal 40 is also connected through a capacitor 41 to ground. A second lead 45 of the secondary coil 27 is connected through a resistor 46 to ground and to the anode of a diode 47, the cathode of which is connected to a terminal 48. The terminal 48 is connected through a feed through capacitor 49 and a capacitor 50 located within the shield 34 to the lead 26 on the opposite side of the coil 25 from the connection of the capacitor 38. The terminal 48 is also connected through a resistor 51 to a second output terminal 52. The terminal 52 is connected through a capacitor 53 to ground.

In a simplified version of the operation of the directional power detector 13, assuming a perfect load at the antenna, the lead 26, which is the primary of the transformer, supplies voltages to the terminals 32 and 48 which may be considered equal and in phase for purposes of this discussion. Simultaneously the current flowing in the lead 26 induces a voltage in the secondary which is negative at lead 28 and positive at lead 45, for purposes of this discussion. With the perfect load at the antenna the voltages at lead 45 and terminal 48 are equal and in phase so that the diode 47 is nonconducting. Therefore, no DC voltage appears at the terminal 52. Simultaneously the voltages at the lead 28 and terminal 32 are equal and 180° out of phase so that the diode 31 operates as a half wave rectifier and a voltage appears at the terminal 40 which follows the audio envelope of the RF signal on the lead 26. When the load at the antenna is mismatched the voltages appearing at either side of the diode 47 become unequal and/or out of phase and the diode begins to conduct so that a DC voltage proportional to the reflected power appears at the output terminal 52. The frequency of operation is such that the capacitors 37, 38, 41, 49, 50 and 53 operate as RF bypass or coupling capacitors and provide substantially no audio frequency filtering. Thus, the DC voltage appearing at the terminal 40 is representative of the forward power applied to the antenna and follows the audio envelope of the signal on the lead 26 and the voltage at the output terminal 52 is representative of the reflected power and follows the audio envelope.

Referring specifically to FIG. 3, the output terminals 40 and 52 of the directional power detector 13 are illustrated in conjunction with a schematic diagram of the remainder of the protection circuit. The terminal 40 is connected through a resistor 55 to the negative or inverting input of a Norton type operational amplifier 56. As is well known in the art, Norton type operational amplifiers compare currents rather than voltages and the output voltage is proportional to the differential input currents. A resistor 57 is connected from the inverting input to the output of the operational amplifier 56. The resistor 55 is approximately 39k ohms and the resistor 57 is approximately 100k ohms, in this embodiment, so that the operational amplifier 56 has a gain of approximately 2½ to 1. The positive terminal of the operational amplifier 56 is connected through a resistor 58 to one side of a potentiometer 59, which has the movable arm thereof connected to the same side. The opposite side of the potentiometer 59 is connected to the cathode of a diode 60, the anode of which is connected to a positive voltage bus 65, which is adapted to have a suitable source of voltage applied thereto. The resistor 58, potentiometer 59 and diode 60 provide bias and temperature compensation for the operational amplifier 56 so that the output thereof is normally high with no signal applied to the negative input. As a more positive signal is applied to the negative input the output decreases. The potentiometer 59 is utilized to set the maximum power output of the transmitter by controlling the level of input signal to which the operational amplifier 56 will react. The operational amplifier 56 and its associated bias and feedback network forms the forward power level comparator and amplifier 16.

The output of the operational amplifier 56 is applied through a summing resistor 66 to the inverting input of an operational amplifier 67. The operational amplifier 67 has a feedback resistor 68 connected from the input to the output thereof which is equal in size to the resistor 66 so that a gain of approximately one is provided. A resistor 69 is connected from the positive bus 65 to a positive input terminal of the operational amplifier 67 and a resistor 70 and diode 71 are connected from the positive terminal to ground to provide the operational amplifier 67 with bias and temperature compensation such that the output thereof is normally low with no signal applied to the negative input terminal. The operational amplifier 67 and the feedback and bias circuits form the summing amplifier of the block designated 19 in FIG. 1.

The terminal 52 of the directional power detector 13 is connected through a resistor 75 to an inverting input of an operational amplifier 76. The inverting input of the operational amplifier 76 is also connected through a resistor 77 to ground and through a series connected resistor 78, diode 79 and diode 80 to ground. The positive terminal of the operational amplifier 76 is connected directly to ground making the bias such that the output is normally high with no signal applied at the terminal 52. A feedback resistor 81 is connected from the input to the output of the operational amplifier 76 and, in this embodiment, is approximately 120k ohms. The resistor 75 is approximately 2.2k ohms so that the gain of the operational amplifier 76 is approximately 55 and the DC voltage representative of reflected power has a much greater effect on the protection circuit than the DC voltage representative of forward power. The output of the operational amplifier 76 is applied through a summing resistor 82 to the inverting input of the operational amplifier 67. The operational amplifier 76 and its feedback and bias networks forms the reverse power level comparator and amplifier 17.

The output of the operational amplifier 67 is applied through a resistor 85 to the anodes of two diodes 86 and 87. The cathode of the diode 86 is connected directly to the base of an NPN type transistor 88, through a capacitor 89 to ground and to the anode of a third diode 90. The cathodes of the diodes 87 and 90 are connected together and through a parallel connected resistor 91 and capacitor 92 to ground. The diodes 86, 87 and 90 and the capacitors 89 and 92 form the peak detector portion of the block 19.

The peak detector operates in the following manner. The output of the operational amplifier 67 is normally low with no signal applied so that the capacitors 89 and 92 normally are substantially discharged. As signal is applied to the operational amplifier 67 from either the operational amplifier 56 (forward power level detector), the operational amplifier 76 (reverse power level detector) or both, the output of the operational amplifier 67 begins to rise and charge the capacitors 89 and 92 through the diodes 86 and 87, respectively. Whenever a peak signal appears at the input of the operational amplifier 67 the capacitors 89 and 92 quickly charge to the peak value. However, as the peak subsides the charge is held on the capacitor 89 until the capacitor 92 discharges to a point one diode drop below the charge on the capacitor 89, at which time both capcitors 89 and 92 discharge simultaneously through the resistor 91. Thus, the peak detector has incorporated therein a dual time constant whereby peak voltages are held at the output for a short period of time before being allowed to subside. Thus, a DC control voltage is applied to the base of the transistor 88 which is representative of the peak power delivered to the antenna 14 from the power amplifier 11 and is tailored to provide proper attack and decay characteristics.

The collector of the transistor 88 is connected directly to the positive voltage bus 65 and the emitter is connected through a resistor 95 and resistor 96, in series, so that an emitter follower is formed. The junction of the resistors 95 and 96 is connected directly to the base of the shunt transistor 20. Bypass capacitors 97 and 98 are connected from the collector to the base and from the base to the emitter of the transistor 20, respectively. Thus, conduction of the DC voltage from the peak detector 19, which voltage follows the envelope of the signal at the output of the power amplifier 11 and is proportional to the sum of the forward and reflected power so that the forward and reflected power is accurately controlled to protect the power amplifier 11.

The terminal 40 is also connected to the inverting input of an operational amplifier 100 through a resistor 101. The inverting input of the operational amplifier 100 is also connected through a resistor 102 and resistor 103 to ground. A pair of diodes 104 and 105 are connected in parallel with the resistor 103 and provide temperature compensation for the operational amplifier 100. The positive input of the operational amplifier 100 is connected directly to ground so that it is biased with the output normally high with no signal applied to the inverting input. Further, no feedback resistor is connected around the operational amplifier 100 so that maximum gain is utilized. The output of the operational amplifier 100 is connected through a resistor 110 to the base of a PNP type transistor 111. A resistor 112 is connected between the base of the transistor 111 and the positive voltage bus 65. The emitter of the transistor 111 is connected directly to the positive voltage bus 65 and the collector is connected to ground through a resistor 113 and parallel connected capacitor 114. The collector of the transistor 111 is also connected directly to the base of an NPN type transistor 115. The collector of the transistor 115 is connected directly to the positive voltage bus 65 and the emitter is connected through a resistor 116 to ground. The emitter of the transistor 115 is also connected through a resistor 120 and choke 121 to the base of an NPN type transistor 122. The emitter of the transistor 122 is connected directly to ground and the collector is connected through an indicator light 123 to a positive voltage terminal 124, which may be connected to the positive voltage bus 65 or a higher voltage if required. When a signal appears at the output terminal 40 of the power detector 13 the signal is amplified and energizes the lamp 123 to indicate power is being delivered to the antenna. The amplifier circuitry controls the intensity of the indicator lamp 123, thus, displaying the relative amount of power being delivered to the antenna.

A thermistor 130 is mechanically mounted in engagement with the heat sink of the transmitter to provide an accurate indication of the heat therein. One side of the thermistor 130 is connected to ground and the other side is connected directly to the base of a PNP type transistor 131. The base is also connected through a resistor 132 to the positive voltage bus 65. The emitter is connected directly to the emitter of a second PNP type transistor 133 and through a resistor 134 to the positive voltage bus 65. The collector of the transistor 131 is connected to the collector of the transistor 133 and through a resistor 135 to the inverting input terminal of the operational amplifier 56. The base of the transistor 133 is connected through a resistor 136 to the positive voltage bus 65 and through a resistor 137 to one side of a thermistor 138, the other side of which is connected to ground. The thermistor 138 is mechanically mounted on the output transformer of the transmitter to monitor the heat thereof. When either or both of the thermistors 130 and 138 become hot enough to cause conduction of the transistors 131 and 133, respectively, a signal is applied to the inverting input of the operational amplifier 56 which, as previously described, ultimately causes the transistor 20 to shunt some of the signal from the power amplifier 11 so that the power applied to the antenna is reduced and the heat in the heat sink and output transformer is reduced.

Circuitry is provided to cause the output power of the transmitter to be held to a low, constant, power to facilitate tuning of the antenna tuner. The circuitry includes a PNP type transistor 140 having an emitter connected directly to the positive voltage bus 65 and a collector connected to the center tap of the potentiometer 59 at the positive input of the operational amplifier 56. A resistor 141 is connected from the emitter to an externally accessible terminal 142. A resistor 143 is connected from the base of the transistor 140 to the terminal 142. A second PNP type transistor 139 has a base connected through a resistor 144 to the terminal 142 and an emitter connected directly to the positive voltage bus 65. The collector is connected to one side of a potentiometer 145 and to the movable contact and the other end of the potentiometer 145 is connected through a resistor 146 to the inverting input of the operational amplifier 56. The circuit described is placed in operation by connecting a wire from the terminal 142 to ground. Grounding terminal 142 causes both of the transistors 139 and 140 to conduct which alters the bias on the operational amplifier 56 and holds the output power at a constant value in accordance with the setting of the potentiometer 145, for example 10 watts.

Thus, a power amplifier protection circuit for a single sideband transmitter is disclosed which accurately monitors the forward and reflected peak envelope power at the output of the transmitter and controls the RF drive to the power amplifier to limit the output power to a specified level, without generating substantial distortion or spurious output signals. Further, most of the circuitry can be included in a single IC circuit for convenience and cost. Also, the intensity of the indicator lamp is controlled in accordance with the relative amount of power being delivered to the antenna so that an accurate indicator is included. In addition to the above temperature is also monitored at specific points in the transmitter and the power is controlled in accordance therewith to insure safe operation of the entire transmitter.

While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of this invention.

We claim:

1. A protection circuit for a power amplifier used in a single sideband transmitter to supply RF power modulated with an audio signal to an antenna and wherein said power varies with the power of the audio signal, said protection circuit comprising:
   a. directional power detector means coupled between the power amplifier and the antenna and having a first output for providing thereon a first audio frequency signal varying in accordance with the modulating audio signal and indicative of forward power supplied to the antenna and a second output for providing thereon a second audio frequency signal varying in accordance with the modulating audio signal and indicative of reflected power from the antenna;
   b. first level comparator means coupled to the first output of said directional power detector means and providing an output signal varying in accordance with the first audio frequency signal applied thereto about a predetermined level;
   c. second level comparator means coupled to the second output of said directional power detector means and providing an output signal varying in accordance with the second audio frequency signal applied thereto about a predetermined level;
   d. summing means coupled to said first and second level comparator means for receiving the output signals therefrom and providing an output signal indicative of the sum thereof;
   e. peak detector means coupled to said summing means for receiving the output signal therefrom and providing a DC potential at an output thereof which is proportional to the magnitude of the output signal from said summing means; and
   f. attenuating means having a control input coupled to said peak detector means and an output coupled to the power amplifier for reducing the amplitude of signals supplied to the power amplifier in accordance with the DC potential at the output of said peak detector to control peak envelope power at the antenna.

2. A protective circuit as claimed in claim 1 wherein the first and second level comparator means include first and second operational amplifiers, respectively.

3. A protection circuit as claimed in claim 2 wherein the second operational amplifier is designed to have substantially higher gain than the first operational amplifier for making the protection circuit more sensitive to reflected power than forward power.

4. A protection circuit as claimed in claim 1 wherein the peak detector means includes dual time constant circuitry for providing the peak detector means with relatively fast attack and slow decay times.

5. A protection circuit as claimed in claim 1 including in addition indicator means coupled to the first output of the directional power detector means for providing an indication of the relative amount of power being delivered to the antenna.

6. A protection circuit as claimed in claim 1 including in addition heat sensitive means mechanically coupled to preselected portions of the transmitter and electrically coupled to one of the first and second level detector means for supplying an input signal thereto representative of the heat of the preselected portions.

7. A protection circuit as claimed in claim 1 wherein the attenuating means includes a transistor which operates to shunt a variable portion of the signals supplied to the power amplifier away from the power amplifier.

8. A protection circuit as claimed in claim 1 wherein the first level comparator means includes an adjustable component for varying the predetermined level thereof and controlling the maximum peak power applied to the antenna.

* * * * *